(12) United States Patent
Han

(10) Patent No.: US 11,315,911 B2
(45) Date of Patent: Apr. 26, 2022

(54) COMBINED DISPLAY PANEL WITH OVERLAPPING SUB-SCREENS

(71) Applicant: SHENZHEN CHINA STAR OPTOELECTRONICS SEMICONDUCTOR DISPLAY TECHNOLOGY CO., LTD., Shenzhen (CN)

(72) Inventor: Baixiang Han, Shenzhen (CN)

( * ) Notice: Subject to any disclaimer, the term of this patent is extended or adjusted under 35 U.S.C. 154(b) by 301 days.

(21) Appl. No.: 16/617,513

(22) PCT Filed: Aug. 23, 2019

(86) PCT No.: PCT/CN2019/102244
§ 371 (c)(1),
(2) Date: Nov. 27, 2019

(87) PCT Pub. No.: WO2021/017060
PCT Pub. Date: Feb. 4, 2021

(65) Prior Publication Data
US 2021/0366882 A1 Nov. 25, 2021

(30) Foreign Application Priority Data

Jul. 29, 2019 (CN) .......................... 201910686449.0

(51) Int. Cl.
*H01L 25/13* (2006.01)
*H01L 33/42* (2010.01)
*G09F 9/30* (2006.01)

(52) U.S. Cl.
CPC ............... *H01L 25/13* (2013.01); *G09F 9/30* (2013.01); *H01L 33/42* (2013.01)

(58) Field of Classification Search
CPC . H01L 27/32; H01L 27/3206; H01L 27/3211; H01L 27/3216; H01L 27/3218; H01L 25/13; H01L 33/42; G09F 9/30; G09F 9/301

See application file for complete search history.

(56) References Cited

U.S. PATENT DOCUMENTS

| 2012/0293741 A1 | 11/2012 | Gu et al. |
| 2014/0110726 A1 | 4/2014 | Naijo |
| 2015/0041766 A1 | 2/2015 | Naijo |

FOREIGN PATENT DOCUMENTS

| CN | 102169266 A | | 8/2011 |
| CN | 103779383 A | | 5/2014 |
| CN | 105244364 A | | 1/2016 |
| CN | 106158904 A | | 11/2016 |
| CN | 108364973 A | * | 8/2018 |
| CN | 108598120 A | | 9/2018 |
| CN | 109860247 A | | 6/2019 |

* cited by examiner

*Primary Examiner* — John P. Dulka

(57) ABSTRACT

A combined display panel including a first sub-screen and a second sub-screen. The first sub-screen includes a first display surface and a second display surface disposed on a back of the first display surface, the first display surface includes a plurality of first sub-pixels, the second display surface includes a plurality of second sub-pixels, and the second sub-screen includes a plurality of third sub-pixels. The combined display panel provided by the present application can improve the aperture ratio of the display panel in the prior art.

11 Claims, 2 Drawing Sheets

COMBINED DISPLAY PANEL WITH OVERLAPPING SUB-SCREENS

CROSS REFERENCE TO RELATED APPLICATION

This application claims the priority of International Application No. PCT/CN2019/102244, filed on 2019 Aug. 23, which claims priority to Chinese Application No. 201910686449.0, filed on 2019 Jul. 29. The entire disclosures of each of the above applications are incorporated herein by reference.

BACKGROUND OF INVENTION

Field of Invention

The present invention relates to the field of electronic display, and in particular, to a combined display panel.

Description of Prior Art

With the continuous development of display technology, users have higher requirements for resolution and service life of display panels. However, due to the process capability, as the resolution increases, aperture ratio and service life of the display panel will inevitably decrease.

Technical Problems

Referring to FIG. 1, FIG. 1 schematically shows a pixel of a display panel in the prior art. Because only a single-colored light is allowed to pass at the same time, aperture ratio of the display panel in the prior art is only about 33%, which needs to be improved.

SUMMARY OF INVENTION

The present application provides a combined display panel to increase the aperture ratio of the display panel in the prior art.

In order to solve the above problems, the present application provides a combined display panel comprising a first sub-screen and a second sub-screen;

wherein the first sub-screen comprises a first display surface and a second display surface disposed on a back of the first display surface, the first display surface comprises a plurality of first sub-pixels, the second display surface comprises a plurality of second sub-pixels;

wherein the second sub-screen comprises a plurality of third sub-pixels;

wherein the first sub-screen and the second sub-screen are overlapped, the plurality of first sub-pixels, second sub-pixels, and third sub-pixels are correspondingly disposed, a first sub-pixel and a second sub-pixel and a third sub-pixel corresponding to the first sub-pixel constitute a pixel unit of the combined display panel.

According to one aspect of the application, wherein the first sub-pixels, second sub-pixels, and third sub-pixels have a same shape and area.

According to one aspect of the application, wherein the first sub-screen is a two-way illuminated display screen, the first display surface and the second display surface are respectively disposed on two light emitting surfaces of the first sub-screen.

According to one aspect of the application, wherein an anode of the first sub-screen is a transparent electrode, and a cathode of the first sub-screen is a transparent electrode.

According to one aspect of the application, wherein the first display surface comprises a first display area and a first non-display area, the plurality of first sub-pixels are disposed on the first display area, the first non-display area is disposed adjacent to the first display area for setting a first control circuit;

wherein the second display surface comprises a second display area and a second non-display area, the plurality of second sub-pixels are disposed on the second display area, the second non-display area is disposed adjacent to the second display area for setting a second control circuit.

According to one aspect of the application, wherein the second sub-screen is a single-sided illuminated display screen, and a light-emitting surface of the second sub-screen is disposed toward the first sub-screen.

According to one aspect of the application, wherein the third sub-pixel is a red pixel.

According to one aspect of the application, wherein an anode of the second sub-screen is a reflective electrode and a cathode of the second sub-screen is a transparent electrode.

According to one aspect of the application, wherein the third display surface comprises a third display area and a third non-display area, the plurality of third sub-pixels are disposed on the third display area, and the third non-display area is disposed adjacent to the third display area for setting a third control circuit.

According to one aspect of the application, wherein control signals of the first display surface, the second display surface, and the third display surface are same, the first sub-pixel and the corresponding second sub-pixel and third sub-pixel receive a same display information.

According to one aspect of the application, further comprising a plurality of support columns between the first sub-screen and the second sub-screen.

According to one aspect of the application, wherein a material forming the plurality of support columns is a white material or a transparent material, surfaces of support columns have a diffuse reflection structure.

Beneficial Effects

The combined display panel provided by the present application includes a corresponding first sub-screen and a second sub-screen. A plurality of first sub-pixels, second sub-pixels, and third sub-pixels of the present application are disposed on different display surfaces respectively and are correspondingly arranged. In the present application, a first sub-pixel and a second sub-pixel and a third sub-pixel corresponding to the first sub-pixel constitute a pixel unit of the combined display panel. With this arrangement, no matter which sub-pixel emits light, the aperture ratio of the pixel unit of the combined display panel approaches 100%. Therefore, the present application greatly improves the aperture ratio of the display panel and optimizes the display effect of the display panel.

DETAILED DESCRIPTION OF PREFERRED EMBODIMENTS

Figure 1:
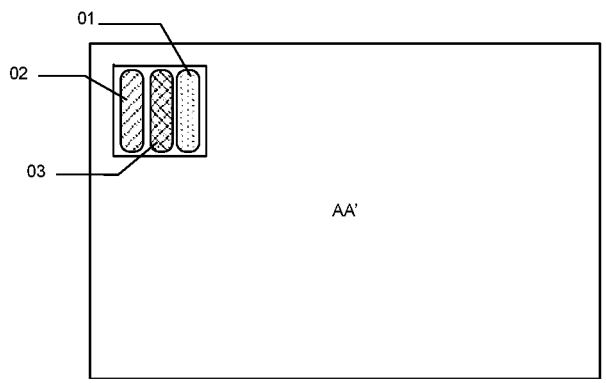
FIG. 1 is a structural diagram of a display panel in the prior art.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, the prior art will be briefly described. Referring to FIG. 1, a display panel of the prior art includes a display area AA', which includes a plurality of pixel units. FIG. 1 exemplarily shows a schematic diagram of one pixel unit, wherein each pixel unit includes a first sub-pixel 01, a second sub-pixel 02, and a third sub-pixel 03. The first sub-pixel 01, the second sub-pixel 02, and the third sub-pixel 03 emit red light, blue light, and green light, respectively. When displaying, each pixel unit can emit only one color of light at the same time, so the aperture ratio of the display panel in the prior art is only about 33%, which needs to be improved.

The present application provides a combined display panel to increase the aperture ratio of the display panel in the prior art.

Figure 2:
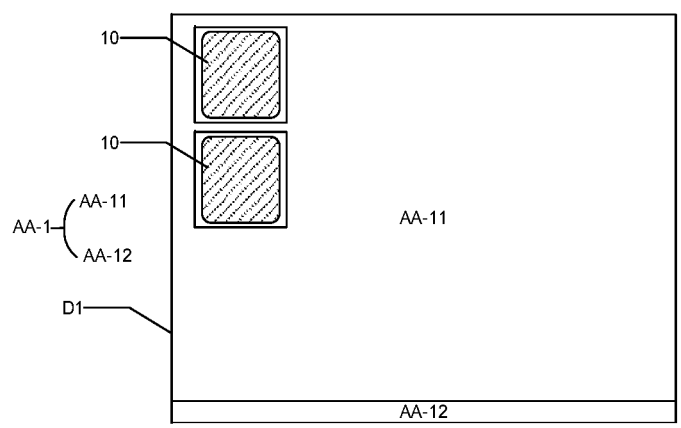
FIG. 2 is a structural diagram of a first display surface of a first sub-screen of a combined display panel in an embodiment of the present application.
Figure 3:
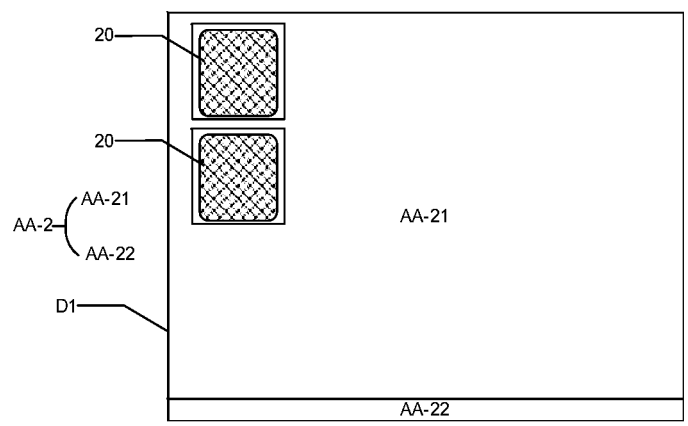
FIG. 3 is a structural diagram of a second display surface of the first sub-screen of the combined display panel in an embodiment of the present application.
Figure 4:
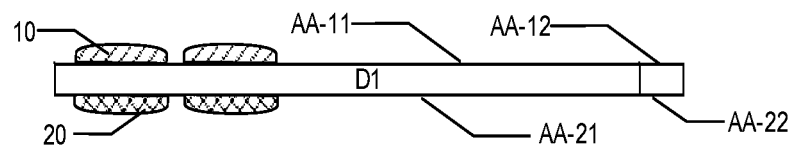
FIG. 4 is a cross-sectional view of the first sub-screen of the combined display panel.
Figure 5:
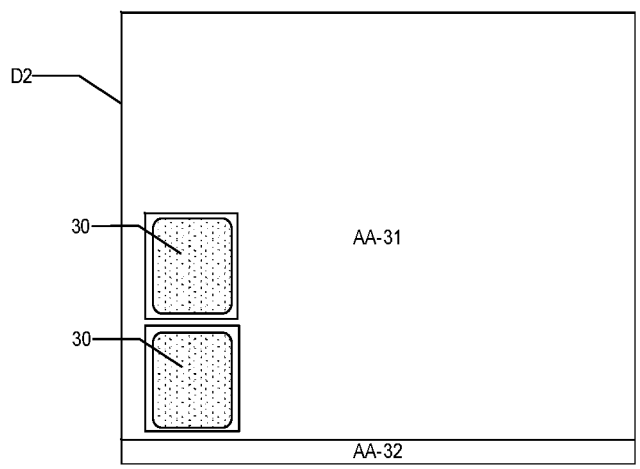
FIG. 5 is a structural diagram of a second sub-screen of a combined display panel according to another embodiment of the present application.
Figure 6:
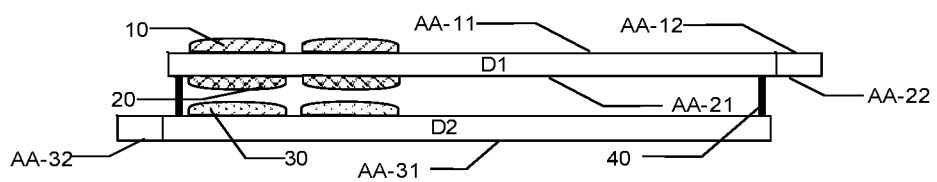
FIG. 6 is a structural diagram of a combined display panel consisting of the first sub-screen and the second sub-screen.

Referring to FIG. 2 to FIG. 6, FIG. 2 is a structural diagram of a first display surface AA-1 of a first sub-screen D1 of a combined display panel in an embodiment of the present application. FIG. 3 is a structural diagram of a second display surface AA-2 of the first sub-screen D1 of the combined display panel in an embodiment of the present application. FIG. 4 is a cross-sectional view of the first sub-screen D1 of the combined display panel. FIG. 5 is a structural diagram of a second sub-screen D2 of a combined display panel according to another embodiment of the present application. FIG. 6 is a structural diagram of a combined display panel consisting of the first sub-screen D1 and the second sub-screen D2.

Referring to FIG. 2 and FIG. 3, in this application, the combined display panel includes the first sub-screen D1 and the second sub-screen D2. The first sub-screen D1 comprises the first display surface AA-1 and the second display surface AA-2 disposed on a back of the first display surface AA-1, the first display surface AA-1 comprises a plurality of first sub-pixels 10, and the second display surface comprises a plurality of second sub-pixels 20. The second sub-screen D2 comprises a third display surface AA-3 including a plurality of third sub-pixels 30.

Referring to FIG. 6, the first sub-screen D1 and the second sub-screen D2 are overlapped, the plurality of first sub-pixels 10, second sub-pixels 20, and third sub-pixels 30 are correspondingly disposed, a first sub-pixel 10 and a second sub-pixel 20 and a third sub-pixel 30 corresponding to the first sub-pixel 10 constitute a pixel unit of the combined display panel. In this embodiment, the first sub-screen D1 is disposed above the second sub-screen D2. To ensure that the three sub-pixels consisting the pixel unit are aligned completely, the first sub-pixels 10, second sub-pixels 20, and third sub-pixels 30 have same shapes and areas. In this embodiment, in order to increase the aperture ratio of the display panel, the shapes of the first sub-pixels 10, the second sub-pixels 20, and the third sub-pixels 30 are rectangular, but they are not limited to other shapes, such as circles or other regular polygons.

In the present application, the first sub-screen D1 is a two-way illuminated display screen, and the first display surface AA-1 and the second display surface AA-2 are respectively disposed on two light emitting surfaces of the first sub-screen D1. An anode of the first sub-screen D1 is a transparent electrode, and a cathode of the first sub-screen D1 is a transparent electrode. The second sub-screen D2 is a single-sided illuminated display screen, and the light-emitting surface of the second sub-screen D2 is disposed toward the first sub-screen D1. An anode of the second sub-screen D2 is a reflective electrode and a cathode of the second sub-screen D2 is a transparent electrode. The reflective electrode can be a metal electrode such as silver, copper, gold, or the like having good electrical conductivity and reflectivity. The transparent electrode can be a transparent conductive material such as indium tin oxide.

In this embodiment, the third sub-pixel 30 is a red pixel. This is because, among the three colors of red, green and blue, the red light has the longest wavelength and the corresponding penetration ability is also the strongest. Since the third sub-pixel 30 is farthest from the light-emitting surface of the display panel, it needs to penetrate the first sub-screen D1 to reach the light emitting surface, and the corresponding light loss is the greatest. In this embodiment, setting the third sub-pixel 30 as a red pixel can minimize the light loss. In addition, such arrangement can also make the light emitted by a plurality of pixel points more uniform, and enhance the display effect of the display panel.

Correspondingly, due to the wavelength of the blue light being the shortest, its corresponding penetration ability is also the weakest. In order to reduce the light loss, the blue pixels are prevented from accelerated aging due to excessive loss. In this embodiment, the first sub-pixels 10 are set as blue pixels. The first sub-pixels 10 are disposed on the display surface closest to the light emitting surface of the display panel.

In the prior art, since the aging speed of the blue pixels is fast, a lifespan of the blue pixels determines a lifespan of the display panel. The display panel of the present invention sets the blue pixels on the display surface closest to the light emitting surface of the display panel, and greatly reduces the power consumption of the blue pixels. Therefore, the display panel of the present application significantly slows down the aging of the blue pixels, thereby extending the lifespan of the display panel.

In this embodiment, the first display surface AA-1 comprises a first display area AA-11 and a first non-display area AA-12, the plurality of first sub-pixels 10 are disposed on the first display area AA-11, and the first non-display area AA-12 is disposed adjacent to the first display area AA-11 for setting a first control circuit. The second display surface AA-2 comprises a second display area AA-21 and a second non-display area AA-22, the plurality of second sub-pixels 20 are disposed on the second display area AA-21, and the second non-display area AA-22 is disposed adjacent to the second display area AA-21 for setting a second control circuit.

In this embodiment, the third display surface comprises a third display area AA-31 and a third non-display area AA-32, the plurality of third sub-pixels 30 are disposed on the third display area AA-31, and the third non-display area AA-32 is disposed adjacent to the third display area AA-31 for setting a third control circuit.

In this embodiment, the first sub-screen D1 and the second sub-screen D2 are rectangular. The first non-display area AA-12 is disposed along one side of the first sub-screen D1. The second non-display area AA-22 is disposed correspondingly to the first non-display area AA-12 along one side of the second sub-screen D2. The second non-display area AA-22 has a same shape and area as the first non-display area AA-12. The third non-display area AA-32 is disposed correspondingly to the first non-display area AA-12 and the second non-display area AA-22 along one side of the second sub-screen D2. The third non-display area AA-32 has a same shape and area as the first non-display area AA-12.

In this embodiment, control signals of the first display surface AA-1, the second display surface AA-2, and the third display surface are same. The first sub-pixel 10 and the corresponding second sub-pixel 20 and third sub-pixel 30 receive a same display information.

Referring to FIG. 2 and FIG. 3, a distribution pattern of the plurality of first sub-pixels 10 on the first display surface AA-1 and a distribution pattern of the plurality of second sub-pixels 20 on the second display surface AA-2 are identical. A distribution pattern of the plurality of third sub-pixels 30 on the third display surface AA-3 is axisymmetric with the distribution pattern of the plurality of first sub-pixels 10 on the first display surface AA-1. Referring to FIG. 6, when overlapping, the second sub-screen D2 flips over the first sub-screen D1 along an axis of symmetry. The two non-display areas of the combined display screen in this embodiment are respectively located on both sides of the display area. Since there is no occlusion above the non-display area, the first sub-screen D1 and the second sub-screen D2 in this embodiment can be combined more easily.

In an embodiment of the present application, the combined display panel further includes a plurality of support columns 40 between the first sub-screen D1 and the second sub-screen D2. Heights of the support columns 40 are same. On the one hand, the support columns 40 are used for supporting the second sub-screen D2 to disperse the pressure applied to the first sub-screen D1 by the second sub-screen D2 and prevent the first sub-screen D1 from cracking due to uneven force. On the other hand, the support columns 40 can ensure that a distance between the first sub-screen D1 and the second sub-screen D2 is kept constant, and prevent pixel cell offset due to a change in distance between the first sub-screen D1 and the second sub-screen D2. Preferably, in order to prevent the support columns 40 from forming a spot or a shadow on the display panel, a material forming the support columns 40 is a white material or a transparent material, and surfaces of the plurality of support pillars 40 have a diffuse reflection structure.

The combined display panel provided by the present application includes a correspondingly disposed first sub-screen and a second sub-screen. A plurality of first sub-pixels, second sub-pixels, and third sub-pixels of the present application are disposed on different display surfaces respectively and are correspondingly arranged. In the present application, a first sub-pixel and a second sub-pixel and a third sub-pixel corresponding to the first sub-pixel constitute a pixel unit of the combined display panel. With this arrangement, no matter which sub-pixel emits light, the aperture ratio of the pixel unit of the combined display panel approaches 100%. Therefore, the present application greatly improves the aperture ratio of the display panel and optimizes the display effect of the display panel.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A combined display panel comprising a first sub-screen and a second sub-screen;
    wherein the first sub-screen comprises a first display surface and a second display surface disposed on a back of the first display surface, the first display surface comprises a plurality of first sub-pixels, and the second display surface comprises a plurality of second sub-pixels;
    wherein the second sub-screen comprises a plurality of third sub-pixels;
    wherein the first sub-screen and the second sub-screen are overlapped, the plurality of first sub-pixels, second sub-pixels, and third sub-pixels are correspondingly disposed, and a first sub-pixel and a second sub-pixel and a third sub-pixel corresponding to the first sub-pixel constitute a pixel unit of the combined display panel,
    wherein the first sub-screen is a two-way illuminated display screen and comprises two light-emitting surfaces, and the first display surface and the second display surface are respectively disposed on the two light-emitting surfaces of the first sub-screen.

2. The combined display panel according to claim 1, wherein the plurality of first sub-pixels, second sub-pixels, and third sub-pixels have same shapes and areas.

3. The combined display panel according to claim 1, wherein an anode of the first sub-screen is a transparent electrode, and a cathode of the first sub-screen is a transparent electrode.

4. The combined display panel according to claim 3,
    wherein the first display surface comprises a first display area and a first non-display area, the plurality of first sub-pixels are disposed on the first display area, and the first non-display area is disposed adjacent to the first display area for setting a first control circuit;
    wherein the second display surface comprises a second display area and a second non-display area, the plurality of second sub-pixels are disposed on the second display area, and the second non-display area is disposed adjacent to the second display area for setting a second control circuit.

5. The combined display panel according to claim 1, further comprising a plurality of support columns between the first sub-screen and the second sub-screen.

6. The combined display panel according to claim 5, wherein a material forming the plurality of support columns is a white material or a transparent material, and surfaces of the support columns have a diffuse reflection structure.

7. A combined display panel comprising a first sub-screen and a second sub-screen;

wherein the first sub-screen comprises a first display surface and a second display surface disposed on a back of the first display surface, the first display surface comprises a plurality of first sub-pixels, and the second display surface comprises a plurality of second sub-pixels;

wherein the second sub-screen comprises a plurality of third sub-pixels;

wherein the first sub-screen and the second sub-screen are overlapped, the plurality of first sub-pixels, second sub-pixels, and third sub-pixels are correspondingly disposed, and a first sub-pixel and a second sub-pixel and a third sub-pixel corresponding to the first sub-pixel constitute a pixel unit of the combined display panel, wherein the second sub-screen is a single-sided illuminated display screen, and a light-emitting surface of the second sub-screen is disposed toward the first sub-screen.

8. The combined display panel according to claim 7, wherein the third sub-pixel is a red pixel.

9. The combined display panel according to claim 7, wherein an anode of the second sub-screen is a reflective electrode and a cathode of the second sub-screen is a transparent electrode.

10. The combined display panel according to claim 9, wherein a third display surface comprises a third display area and a third non-display area, the plurality of third sub-pixels are disposed on the third display area, and the third non-display area is disposed adjacent to the third display area for setting a third control circuit.

11. The combined display panel according to claim 10, wherein control signals of the first display surface, the second display surface, and the third display surface are same, and the first sub-pixel and the corresponding second sub-pixel and third sub-pixel receive a same display information.

* * * * *